US009709645B2

(12) United States Patent
Lee et al.

(10) Patent No.: US 9,709,645 B2
(45) Date of Patent: Jul. 18, 2017

(54) PHASED ARRAY RF COIL FOR MAGNETIC RESONANCE IMAGING

(71) Applicants: SAMSUNG ELECTRONICS CO., LTD., Suwon-si (KR); Industry Academic Cooperation Foundation Kyunghee University, Yongin-si (KR)

(72) Inventors: Ju-hyung Lee, Gwacheon-si (KR); Soo-yeol Lee, Yongin-si (KR)

(73) Assignees: SAMSUNG ELECTRONICS CO., LTD., Suwon-si (KR); Industry Academic Cooperation Foundation Kyunghee University, Yongin-si (KR)

( * ) Notice: Subject to any disclaimer, the term of this patent is extended or adjusted under 35 U.S.C. 154(b) by 764 days.

(21) Appl. No.: 14/075,455

(22) Filed: Nov. 8, 2013

(65) Prior Publication Data
US 2014/0125339 A1    May 8, 2014

(30) Foreign Application Priority Data

Nov. 8, 2012  (KR) .................. 10-2012-0126161

(51) Int. Cl.
*G01V 3/00*  (2006.01)
*G01R 33/3415*  (2006.01)
(Continued)

(52) U.S. Cl.
CPC .... *G01R 33/3415* (2013.01); *G01R 33/34007* (2013.01); *G01R 33/3628* (2013.01)

(58) Field of Classification Search
CPC ............. G01R 33/3815; G01R 33/383; G01R 33/3806; G01R 33/3873; G01R 33/3802
(Continued)

(56) References Cited

U.S. PATENT DOCUMENTS

| 4,694,255 A | 9/1987 | Hayes |
| 4,783,641 A | 11/1988 | Hayes et al. |

(Continued)

FOREIGN PATENT DOCUMENTS

| CN | 101872001 A | 10/2010 |
| CN | 102680922 A | 9/2012 |

(Continued)

OTHER PUBLICATIONS

Zhang et al., "A microstrip transmission line volume coil for human head MR imaging at 4 T", Journal of Magnetic Resonance 161 (2003) 242-251, received Mar. 22, 2002; revised Dec. 6, 2002, published 2003.

(Continued)

*Primary Examiner* — Walter L Lindsay, Jr.
*Assistant Examiner* — Frederick Wenderoth
(74) *Attorney, Agent, or Firm* — Sughrue Mion, PLLC

(57) ABSTRACT

A phased array radio-frequency (RF) coil includes a cylindrical frame including a coaxial inner frame and a coaxial outer frame having different diameters; and vertical loop coils arranged in a circumferential direction of the cylindrical frame. Each vertical loop coil includes an inner conductor extending in a lengthwise direction on the coaxial inner frame; an outer conductor extending in a lengthwise direction on the coaxial outer frame and facing the inner conductor; and a first resonant frequency adjustment capacitor for connecting one end of the inner conductor in the lengthwise direction and one end of the outer conductor in the lengthwise direction so that the phased array RF coil resonates at an MR operating frequency.

24 Claims, 9 Drawing Sheets

(51) Int. Cl.
*G01R 33/34* (2006.01)
*G01R 33/36* (2006.01)

(58) Field of Classification Search
USPC .......................................................... 324/319
See application file for complete search history.

(56) References Cited

U.S. PATENT DOCUMENTS

| | | | |
|---|---|---|---|
| 5,191,289 | A | 3/1993 | Hayakawa et al. |
| 5,557,247 | A | 9/1996 | Vaughn, Jr. |
| 5,886,596 | A | 3/1999 | Vaughan, Jr. |
| 6,008,649 | A | 12/1999 | Boskamp et al. |
| 6,501,274 | B1 * | 12/2002 | Ledden ............... G01R 33/3453 324/318 |
| 7,598,739 | B2 * | 10/2009 | Vaughan, Jr. .... G01R 33/34046 324/318 |
| 8,089,280 | B2 | 1/2012 | Soutome et al. |
| 2006/0214661 | A1 * | 9/2006 | Steen ................... G01R 33/583 324/318 |
| 2008/0061785 | A1 | 3/2008 | Soutome et al. |
| 2008/0150533 | A1 | 6/2008 | Habara et al. |
| 2009/0099444 | A1 * | 4/2009 | Bogdanov ........ G01R 33/34046 600/422 |
| 2010/0060283 | A1 * | 3/2010 | Findeklee ........ G01R 33/34007 324/318 |
| 2012/0112748 | A1 * | 5/2012 | Hetherington ... G01R 33/34007 324/318 |
| 2013/0314091 | A1 * | 11/2013 | Otake .................. G01R 33/365 324/322 |

FOREIGN PATENT DOCUMENTS

| | | |
|---|---|---|
| EP | 0436967 A1 | 7/1991 |
| JP | 9-80140 A | 3/1997 |
| JP | 2008-67807 A | 3/2008 |
| JP | 2008-119091 A | 5/2008 |

OTHER PUBLICATIONS

Sacolick et al., "B1 Mapping by Bloch-Siegert Shift", Magnetic Resonance in Medicine 63:1315-1322 (2010), received Aug. 13, 2009; revised Nov. 19, 2009; accepted Dec. 21, 2009, published 2010.

Katscher et al., "Transmit SENSE", Magnetic Resonance in Medicine 49:144-150 (2003), received Jun. 25, 2002; revised Aug. 30, 2002; accepted Sep. 4, 2002, published 2003.

Communication, dated Nov. 18, 2013, issued by the Korean Intellectual Property Office in counterpart Korean Patent Application No. 10-2012-0126161.

Communication issued Dec. 31, 2015, issued by the State Intellectual Property Office of the People's Republic of China in counterpart Chinese Patent Application No. 201310553172.7.

Communication dated May 15, 2014 issued by the Korean Intellectual Property Office in counterpart Korean Application No. 10-2012-0126161.

* cited by examiner

PHASED ARRAY RF COIL FOR MAGNETIC RESONANCE IMAGING

CROSS-REFERENCE TO RELATED PATENT APPLICATION

This application claims priority from Korean Patent Application No. 10-2012-0126161, filed on Nov. 8, 2012, in the Korean Intellectual Property Office, the disclosure of which is incorporated herein in its entirety by reference.

BACKGROUND

1. Field

Apparatuses and methods consistent with exemplary embodiments relate to a radio-frequency (RF) coil and a magnetic resonance imaging (MRI) apparatus employing the same, and more particularly, to a phased array RF coil having an improved structure for improving uniformity of an RF magnetic field and an MRI apparatus employing the same.

2. Description of the Related Art

A magnetic resonance imaging (MRI) apparatus obtains an image of a cross section of a human body using nuclear magnetic resonance (NMR). The atomic nuclei present in a human body, e.g., hydrogen (1H), phosphorus ($3^1$P), natrium ($2^3$Na), and carbon isotropes ($1^3$C), have unique rotating magnetic field constants according to NMR. Thus, an image of the inside of a human body may be obtained by applying electromagnetic waves toward the human body to cause magnetization vectors of the atomic nuclei to resonate and receiving a magnetic resonance signal generated by the magnetic vectors lying in a vertical plane due to the resonance. In this case, a radio-frequency (RF) coil is used to apply electromagnetic waves toward the human body to cause the magnetization vectors of the atomic nuclei in the human body to resonate and receive the magnetic resonance signal generated by the magnetic vectors lying in the vertical plane due to the resonance. One RF coil may be used to cause the magnetization vectors to resonate (transmission mode) and to receive the magnetic resonance signal (reception mode). Otherwise, two coils, i.e., an RF coil only for the transmission mode and an RF coil only for the reception mode, may be used to perform the transmission mode and the reception mode. A coil that may be used to perform both the transmission mode and the reception mode is referred to as a transceiving coil, a coil used to perform only the transmission mode is referred to as transmitting coil, and a coil used to perform only the reception mode is referred to as a receiving coil. In general, since the transmitting coil is installed inside a housing of the MRI apparatus, the transmitting coil is formed on a cylindrical (or oval-shaped) frame having a size such that a human body may be placed therein. On the other hand, since the receiving coil is generally attached onto a human body, the receiving coil may be thus formed according to a shape of a desired part of the human body, e.g., a head, neck, or waist.

A signal-to-noise ratio and luminous uniformity of a magnetic resonance image are important factors in evaluating the quality of the magnetic resonance image. The signal-to-noise ratio of the magnetic resonance image is proportional to a main magnetic field, i.e., a magnetic field of an element of the MRI apparatus such as a superconductive electromagnet or a permanent magnet. However, when the main magnetic field increases in a human body, electromagnetic waves decrease in terms of intensity and are delayed, thereby preventing an RF magnetic field from being uniformly formed. When the RF magnetic field is not uniformly formed in the human body, the degree of uniformity of the magnetic resonance image may be lowered. In particular, if the uniformity of a magnetic field in the transmission mode is low, both the degree of uniformity of the magnetic resonance image and the contrast of the magnetic resonance image are degraded.

In an MRI apparatus using a high magnetic field of about 3.0 tesla, a phased array RF coil in which a plurality of RF coils are arranged may be used to form a uniform RF magnetic field in a human body. The uniformity of an RF magnetic field may be increased in a human body by independently controlling the intensities and phases of RF signals supplied to coil elements included in the phased array RF coil. This technique is referred to as B1 shimming.

In general, a phased array transceiving coil or a phased array transmitting coil is formed on a cylindrical or oval-shaped frame that accommodates a human body. Representative examples of a cylindrical RF transceiving/transmitting coil are a birdcage RF coil and a transverse electromagnetic (TEM) coil. Although these coils are each originally designed as a single coil other than a phased array coil, they may be changed into phased array type coils through structural modifications.

SUMMARY

Exemplary embodiments may address at least the above problems and/or disadvantages and other disadvantages not described above. The exemplary embodiments are not required to overcome the disadvantages described above, and an exemplary embodiment may not overcome any of the problems described above.

In general, the birdcage radio-frequency (RF) coil has a structure in which conductor rings are installed at inner and outer sides thereof and are connected via straight line type conductors. To perform B1 shimming, a plurality of ports are placed on the conductor rings and RF power is supplied to and drives the plurality of ports. However, even if the birdcage RF coil is driven at one of the plurality of ports, a magnetic field is uniformly generated relative to and in the entire birdcage RF coil, and thus the efficiency of B1 shimming is low. To perform B1 shimming using the transverse electromagnetic (TEM) coil, coil elements of the TEM coil, i.e., transmission lines, are magnetically separated and driven independently. However, when the TEM coil is formed large enough to generate an image of a human body in its entirety, a phase delay and high current draw occurs in the coil elements of the TEM coil such as the transmission lines, and a distribution of magnetic fields is not uniform in a direction of the transmission lines. Furthermore, it is difficult to manufacture the transmission lines of the TEM coil and to perform impedance matching to operate the TEM coil at a magnetic resonance frequency.

One or more of exemplary embodiments provide a phased array RF coil having a structure improved to fix a non-uniform RF magnetic field in a high magnetic field magnetic resonance image, caused due to a reduction in the wavelengths of electromagnetic waves in a human body, and a magnetic resonance imaging apparatus employing the same.

According to an aspect of an exemplary embodiment, a phased array radio-frequency (RF) coil for magnetic resonance imaging may include a cylindrical frame including a coaxial inner frame and a coaxial outer frame having different diameters, and a plurality of vertical loop coils arranged in a circumferential direction of the cylindrical frame, wherein each vertical loop coil of the plurality of vertical loop coils includes an inner conductor extending in a lengthwise direction on the coaxial inner frame, an outer conductor extending in a lengthwise direction on the coaxial outer frame and facing the inner conductor, and a first resonant frequency adjustment capacitor for connecting one end of the inner conductor in the lengthwise direction and one end of the outer conductor in the lengthwise direction so that the phased array RF coil resonates at a magnetic resonance imaging operating frequency.

The phased array RF coil may further include a second resonant frequency adjustment capacitor for connecting another end of the inner conductor in the lengthwise direction and another end of the outer conductor in the lengthwise direction so that the RF coil resonates at the magnetic resonance imaging operating frequency.

The inner conductor may include a plurality of inner sub conductors divided along the lengthwise direction of the inner frame, and a third resonant frequency adjustment capacitor may be installed between each of the inner sub conductors of the plurality of inner sub conductors.

The outer conductor may include a plurality of outer sub conductors divided along the lengthwise direction of the outer frame, and a fourth resonant frequency adjustment capacitor may be installed between each of the outer sub conductors of the plurality of outer sub conductors.

A number of the inner sub conductors of the plurality of inner sub conductors resulting from the dividing of the inner conductor may be equal to a number of the outer sub conductors of the plurality of outer sub conductors resulting from the dividing of the outer conductor.

Decoupling capacitors may be placed between adjacent vertical loop coils of the plurality of vertical loop coils to independently drive each of the vertical loop coils of the plurality of vertical loop coils.

The outer conductor may include a plurality of outer sub conductors divided along the lengthwise direction of the outer frame, and a fourth resonant frequency adjustment capacitor may be installed between each of the outer sub conductors of the plurality of outer sub conductors.

The plurality of vertical loop coils may be disposed at isogonal intervals along a circumference of the cylindrical frame.

The inner conductor may be a conductor plate, of which a portion is removed.

A width of the outer conductor in the circumferential direction of the outer frame may be greater than a width of the inner conductor in the circumferential direction of the inner frame.

The inner conductor may be a conductor plate that has a curved surface and is bent along a circumference of the inner frame.

The outer conductor may be a conductor plate that has a curved surface and is bent along a circumference of the outer frame.

A central angle of the outer conductor with respect to a central axis on the cylindrical frame may be greater than a central angle of the inner conductor with respect to the central axis on the cylindrical frame.

The outer conductor may include an insulating layer, and a plurality of outer conductor plate pieces arranged to partially overlap, wherein the insulating layer is between the outer conductor plate pieces of the plurality of outer conductor plate pieces.

The plurality of outer conductor plate pieces may include first outer conductor plate pieces disposed at an inner side of the insulating layer and second outer conductor plate pieces disposed at an outer side of the insulating layer, wherein the insulating layer is between the first outer conductor plate pieces and the second outer conductor plate pieces.

The insulating layer may include a plurality of insulating layer pieces, wherein the outer conductor plate pieces of the plurality of outer conductor plate pieces are alternately arranged such that one side of one outer conductor plate piece is disposed below a side of an adjacent outer conductor plate piece opposite to the side of the one outer conductor plate piece, along a circumference of the outer frame, and the insulating layer pieces of the plurality of insulating layer pieces are respectively inserted into two regions at which the outer conductor plate pieces of the plurality of outer conductor plate pieces overlap.

Decoupling capacitors may be disposed between each of the vertical loop coils of the plurality of vertical loop coils to independently drive each of the vertical loop coils of the plurality of vertical loop coils.

According to an aspect of an exemplary embodiment, a radio-frequency system for magnetic resonance imaging may include a phased array radio-frequency (RF) coil for magnetic resonance imaging including a cylindrical frame including a coaxial inner frame and a coaxial outer frame having different diameters, and a plurality of vertical loop coils arranged in a circumferential direction of the cylindrical frame, and a controller for driving the phased array RF coil, wherein each vertical loop coil of the plurality of vertical loop coils includes an inner conductor extending in a lengthwise direction on the coaxial inner frame, an outer conductor extending in a lengthwise direction on the coaxial outer frame and facing the inner conductor, and a first resonant frequency adjustment capacitor for connecting one end of the inner conductor in the lengthwise direction and one end of the outer conductor in the lengthwise direction so that the phased array RF coil resonates at a magnetic resonance imaging operating frequency.

The controller may include a plurality of RF power amplifiers connected to the plurality of vertical loop coils.

A number of the RF power amplifiers of the plurality of RF power amplifiers may be equal to a number of the vertical loop coils of the plurality of vertical loop coils.

The controller may further include a power divider for dividing RF power output from the RF power amplifiers into a plurality of power signals having a predetermined phase difference with respect to one another and supplying the plurality of power signals to the vertical loop coils of the plurality of vertical loop coils, the number of which is equal to a number of the power signals of the plurality of power signals.

The power divider may divide RF power output from the RF power amplifiers into two power signals, wherein the phases of the two power signals are shifted by 180 degrees with respect to each other, and supplies the two power signals to two vertical loop coils that face each other with respect to a central axis on the cylindrical frame.

The phased array RF coil may be either used only in a transmission mode or in both the transmission mode and a reception mode.

According to an aspect of an exemplary embodiment, a magnetic resonance imaging apparatus may include a chamber including a cylindrical hollow portion, a main magnet installed in the chamber, a gradient coil installed in the cylindrical hollow portion of the chamber, a phased array radio-frequency (RF) coil for magnetic resonance imaging including a cylindrical frame installed in the cylindrical hollow portion of the chamber and including a coaxial inner frame and a coaxial outer frame having different diameters, and a plurality of vertical loop coils arranged in a circumferential direction of the cylindrical frame, and a controller for driving and controlling the main magnet, the gradient coil, and the phased array RF coil, wherein each vertical loop of the plurality of vertical loop coils includes an inner conductor extending lengthwise from the coaxial inner frame and in a lengthwise direction, an outer conductor extending lengthwise from the coaxial outer frame and in the lengthwise direction and facing the inner conductor, and a first resonant frequency adjustment capacitor for connecting one end of the inner conductor in the lengthwise direction and one end of the outer conductor in the lengthwise direction so that the phased array RF coil resonates at a magnetic resonance imaging operating frequency.

BRIEF DESCRIPTION OF THE DRAWINGS

The above and/or other aspects will become more apparent by describing certain exemplary embodiments, with reference to the accompanying drawings, in which.

DETAILED DESCRIPTION

Figure 1:
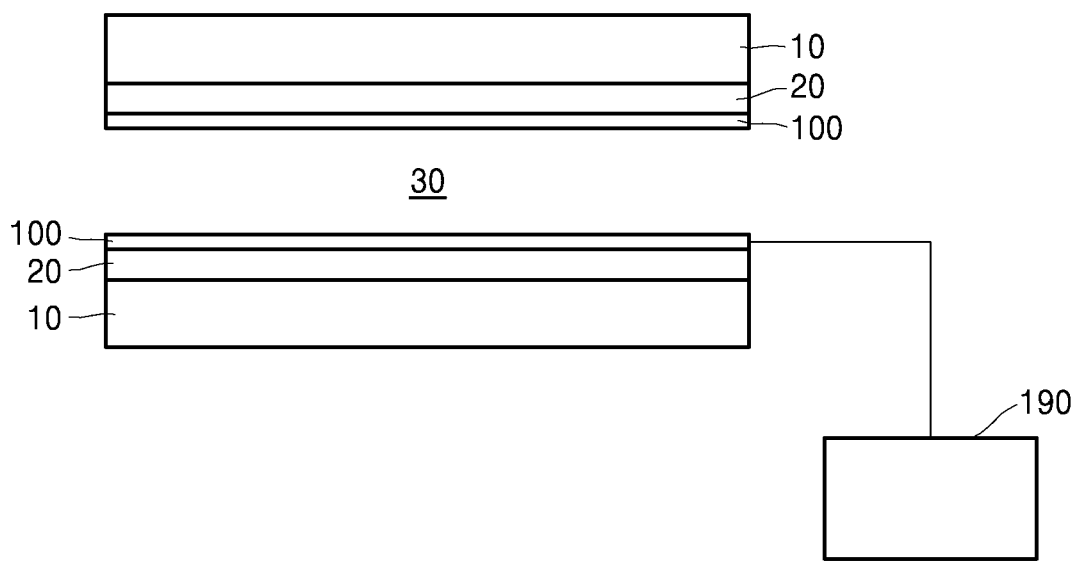
FIG. 1 is a schematic cross-sectional view of a magnetic resonance imaging (MRI) apparatus according to an exemplary embodiment.

Certain exemplary embodiments are described in greater detail below with reference to the accompanying drawings.

In the following description, the same drawing reference numerals are used for the same elements even in different drawings. The matters defined in the description, such as detailed construction and elements, are provided to assist in a comprehensive understanding of exemplary embodiments. Thus, it is apparent that exemplary embodiments can be carried out without those specifically defined matters. Also, well-known functions or constructions are not described in detail since they would obscure exemplary embodiments with unnecessary detail.

FIG. 1 is a schematic cross-sectional view of a magnetic resonance imaging (MRI) apparatus according to an exemplary embodiment.

Referring to FIG. 1, the MRI apparatus has a cylindrical magnetic structure having a hollow portion 30. The cylindrical magnetic structure may include a main magnet 10 that generates a main magnetic field from an outer side to an inner side, a gradient magnetic field coil 20 that generates a gradient magnetic field, and a radio-frequency (RF) coil 100. The MRI apparatus further includes a controller 190 that drives and controls the main magnet 10, the gradient magnetic field coil 20, and the RF coil 100.

The main magnet 10 generates the main magnetic field that magnetizes elements, causing magnetic resonance among elements distributed in a human body, i.e., atomic nuclei, such as hydrogen, phosphorus, and natrium. The main magnet 10 may be a superconductive electromagnet or a permanent magnet. The superconductive electromagnet is used to form a high magnetic field of 0.5 T or more.

The gradient magnetic field coil 20 generates a spatially linear gradient magnetic field to capture a magnetic resonance image. In general, three gradient magnetic field coils that generate gradient magnetic fields in an x-axis direction, a y-axis direction, and a z-axis direction, respectively, are used to capture the magnetic resonance image. The gradient magnetic field coil 20 spatially controls a rotating frequency or phase of a magnetization vector when the magnetization vector rotates in a horizontal plane so that a magnetic resonance image signal may be represented in a spatial frequency domain, i.e., a k-domain.

The magnetization vector should be laid in the horizontal plane to generate the magnetic resonance image signal. To this end, the RF coil 100 is prepared to generate an RF magnetic field based on a Larmor frequency as a main frequency. When RF current having a Larmor frequency band is supplied to the RF coil 100, a rotating magnetic field rotating at the Larmor frequency is generated in the RF coil 100. The rotating magnetic field causes the magnetization vector to resonate, i.e., causes nuclear magnetic resonance (NMR) to occur, thereby causing the magnetization vector to lie in the horizontal plane. Once the magnetization vector lies and is rotating in the horizontal plane at the Larmor frequency, it generates electromotive force in an RF receiving coil according to Faraday's law of electromagnetic induction. A magnetic resonance signal at a base band may be obtained by amplifying an electromotive force signal by using an RF amplifier and modulating a result of amplifying the electromotive force signal by using the sine waves of the Larmor frequency. The magnetic resonance signal at the base band is quantized, transmitted to a computer, and processed to obtain a magnetic resonance image.

Figure 2:
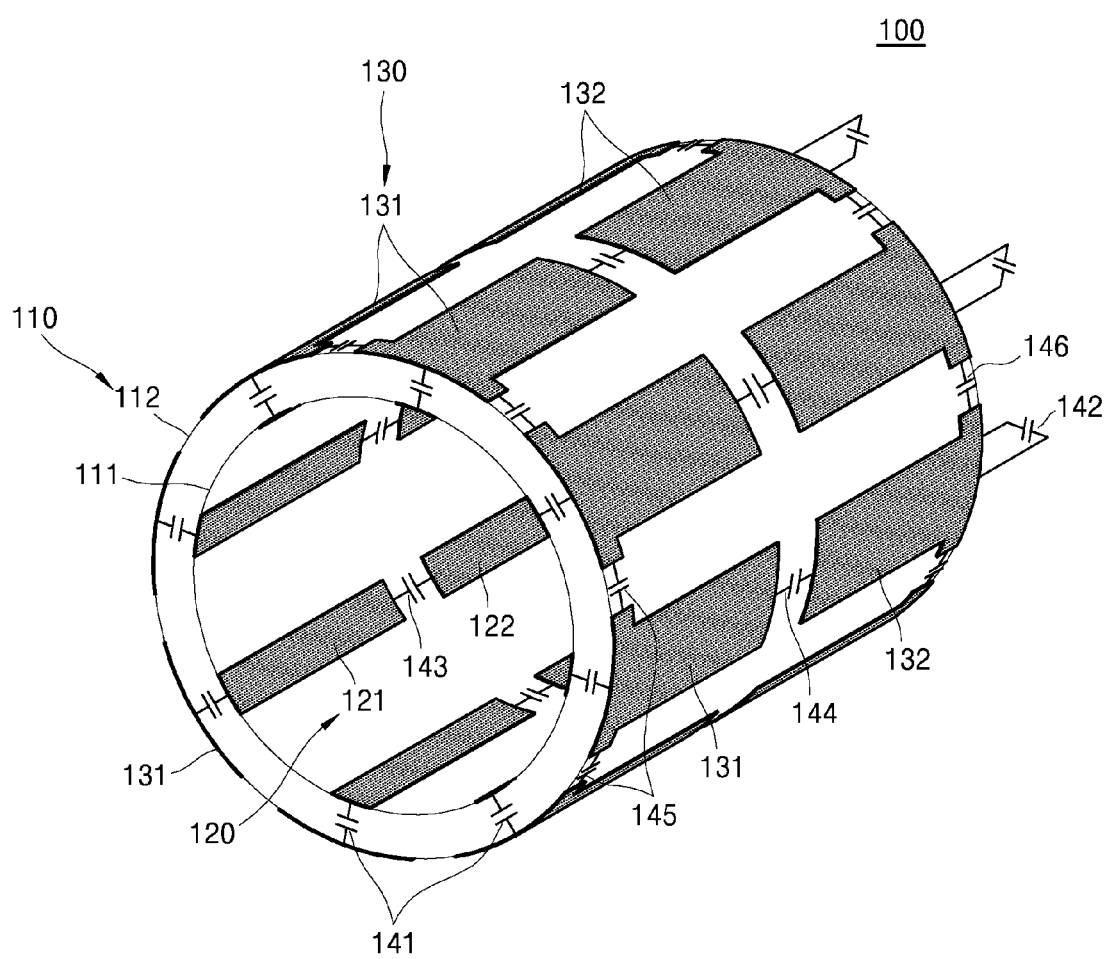
FIG. 2 illustrates a shape of a phased array radio-frequency (RF) coil according to an exemplary embodiment.
Figure 3:
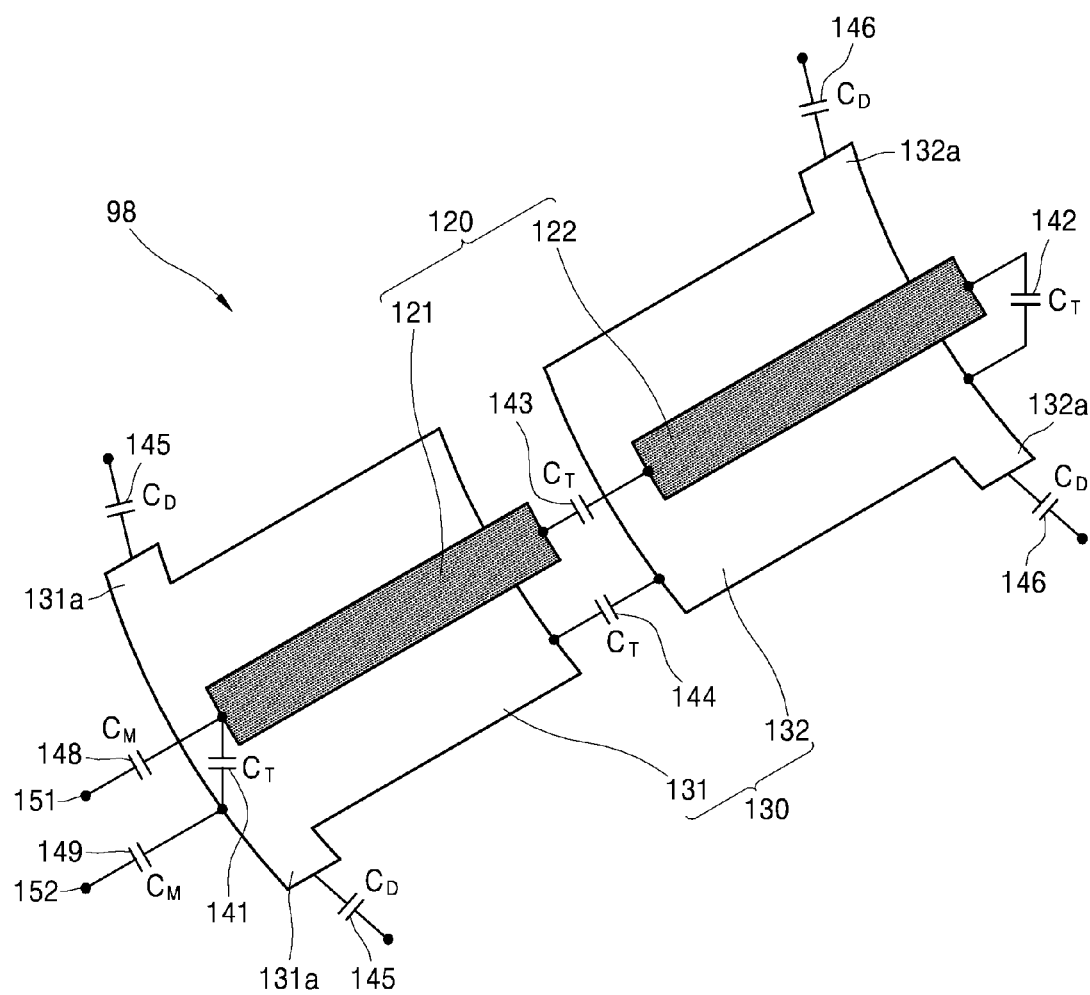
FIG. 3 specifically illustrates a vertical loop coil of the phased array RF coil of FIG. 2 according to an exemplary embodiment.

FIG. 2 illustrates a shape of the RF coil 100 that may be employed in the MRI apparatus of FIG. 1, according to an exemplary embodiment. FIG. 3 specifically illustrates a vertical loop coil of the RF coil 100 according to an exemplary embodiment illustrated in FIG. 2.

Referring to FIG. 2, the RF coil 100 is formed on a cylindrical frame 110. The cylindrical frame 110 includes coaxial inner and outer frames 111 and 112. The cylindrical frame 110 may be a resin mold structure that is integrally formed, and the inner frame 111 and the outer frame 112 may be an inner side surface and an outer side surface of the cylindrical frame 110, respectively. In other case, the cylindrical frame 110 may be a structure manufactured by combining the inner frame 111 and the outer frame 112 that are separately prepared.

One or more inner conductors 120 extend in a lengthwise direction on the inner frame 111. The inner frame 111 may have a curved surface, and the inner conductors 120 may be curved conductor plates that are bent along the circumference of the inner frame 111. The inner conductor 120 may be arranged along the cylindrical circumference of inner frame 111 at isogonal intervals.

Similarly, one or more outer conductors 130 extend in a lengthwise direction on the outer frame 112. The outer frame 112 may also have a curved surface, and the outer conductors 130 may be curved conductor plates that are bent along the circumference of the outer frame 112. Also, the outer conductors 130 may be arranged along the cylindrical circumference of the outer frame 112 at isogonal intervals.

The inner conductors 120 or the outer conductors 130 may be formed of metal having high electric conductivity.

Referring to FIG. 3, one of the inner conductors 120 is disposed to correspond to one of the outer conductors 130 located in a radial direction thereof in one-to-one correspondence. A first resonant frequency adjustment capacitor 141 is installed to electrically connect one end of each of the inner conductors 120 in the lengthwise direction and one end of each of the outer conductors 130 in the lengthwise direction. A second resonant frequency adjustment capacitor 142 is installed to electrically connect the other end of each of the inner conductors 120 in the lengthwise direction and the other end of each of the outer conductors 130 in the lengthwise direction. That is, each of the inner conductors 120 and each of the outer conductors 130 are electrically connected via the first and second resonant frequency adjustment capacitors 141 and 142, thereby forming one lengthwise loop coil 98.

Each of the inner conductors 120 may be divided into two or more parts, e.g., a plurality of inner sub conductors 121 and 122 along the lengthwise direction. A third resonant frequency adjustment capacitor 143 is installed between the plurality of inner sub conductors 121 and 122 to adjust a resonant frequency. Similarly, each of the outer conductors 130 may be divided into two or more parts, e.g., a plurality of outer sub conductors 131 and 132 along the lengthwise direction. A fourth resonant frequency adjustment capacitor 144 is installed between the plurality of outer sub conductors 131 and 132 to adjust a resonant frequency.

The first to fourth resonant frequency adjustment capacitors 141, 142, 143, and 144 are used to adjust the resonant frequency by appropriately selecting a capacitance value $C_T$ so that the RF coil 100 according to the current exemplary embodiment may resonate at a magnetic resonance imaging operating frequency. In the RF coil 100 according to the current exemplary embodiment, some of the first to fourth resonant frequency adjustment capacitors 141, 142, 143, and 144 may be omitted, although adjusting of the resonant frequency may be limited by their omission.

Figure 4:
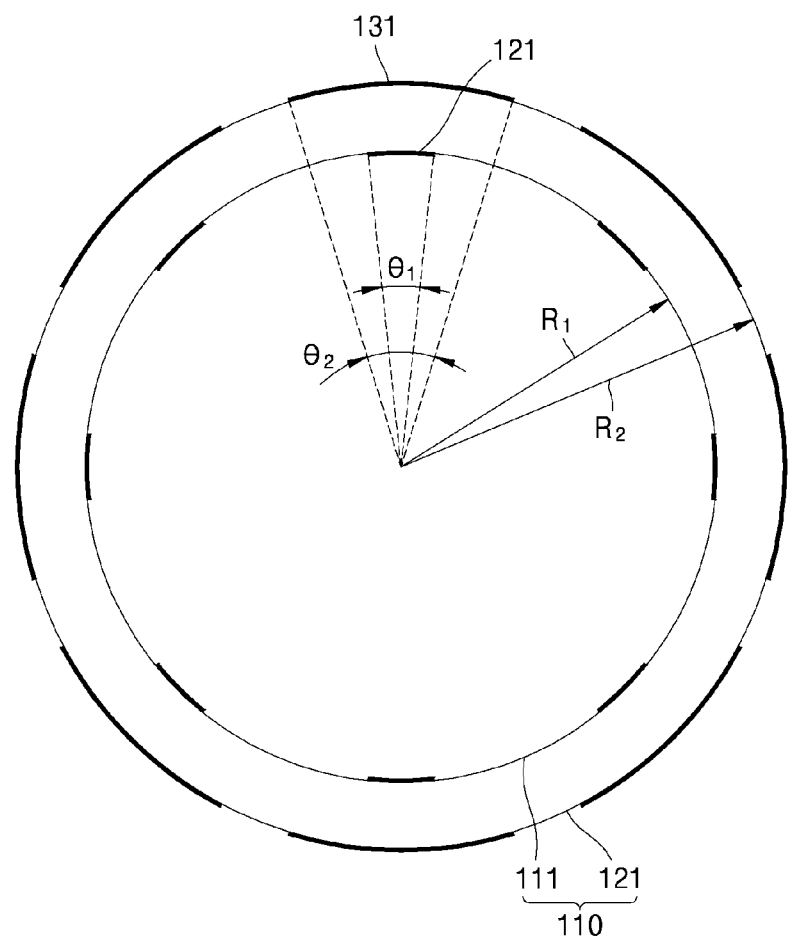
FIG. 4 is a cross-sectional view of the phased array RF coil of FIG. 2.

FIG. 4 is a cross-sectional view of the RF coil 100 of FIG. 2. Referring to FIG. 4, formation of a magnetic field in the RF coil 100 is influenced by a width of the outer conductor 130 in a direction of the circumference of the outer frame 112 and a width of the inner conductor 120 in a direction of the circumference of the inner frame 111. The width of the outer conductor 130 may be greater than that of the inner conductor 120.

In other words, in the inner conductor 120 and the outer conductor 130, a central angle $\theta_2$ of the outer sub conductor 131 (or 132) is greater than a central angle $\theta_1$ of the inner sub conductor 121 (or 122) with respect to a central axis on the cylindrical frame 110, so that the inner conductor 120 may be located within a fan shaped region defined by the outer conductor 130. As described above, an outer surface of a vertical loop coil is covered by the outer conductor 130, and thus, an electric field may be effectively blocked by the outer conductor 130. Furthermore, since a magnetic loop formed by one vertical loop coil is locally formed in an inner space of the outer conductor 130, a magnetic coupling between adjacent vertical loop coils may be suppressed and the uniformity of an RF magnetic field may be improved.

In a high magnetic field MRI apparatus, since the wavelengths of electromagnetic waves decrease as they pass through a human body, formation of a magnetic field in the RF coil 100 is influenced by the shape of the RF coil 100 and also the shape and size of the human body. Thus, the widths of the inner and outer conductors 120 and 130 may be determined in consideration of the size and shape of the human body. To this end, the widths of the inner and outer conductors 120 and 130 may be determined in consideration of an electrical model of the human body, i.e., distributions of the electric conductivity and a dielectric permittivity in the human body. For example, a magnetic field formed in the human body having a particular size and shape by the RF coil 100, according to the current exemplary embodiment, may be calculated according to a numerical analysis method by using an RF electric field analysis method such as a finite difference time domain (FDTD). If, for example, in the RF coil 100, a diameter R1 of the inner frame 111 is 55 cm, a diameter R2 of the outer frame 112 is 60 cm, and lengths of the inner conductor 120 and the outer conductor 130 are each 50 cm, then an optimum distribution of magnetic field was achieved, given a human body of an average body type, when the central angle $\theta 1$ of the inner conductor 120 was 60 degrees and the central angle $\theta 2$ of the outer conductor 130 was 24 degrees at an operating frequency of 123 MHz, according to the numerical interpretation method.

As described above, the inner conductors 120 and the outer conductors 130 are arranged at isogonal intervals along the circumference of the cylindrical frame 110, thereby forming a plurality of vertical loop coils. A magnetic coupling between adjacent vertical loop coils in the RF coil 100 according to the current exemplary embodiment is low, since an electric field is blocked by the outer conductors 130. To further minimize the magnetic coupling, decoupling capacitors 145 and 146 may be inserted between adjacent vertical loop coils. For example, wings 131a and 132a may extend from both ends of the outer sub conductors 131 and 132 in the direction of the circumference of the cylindrical frame 110, respectively, and the decoupling capacitors 145 and 146 may be electrically connected to the wings 131a and 132a, respectively. The decoupling capacitors 145 and 146 may control the amount of current leaking to adjacent vertical loop coils by adjusting a capacitance value $C_D$, thereby compensating for the mutual magnetic coupling.

Figure 5:
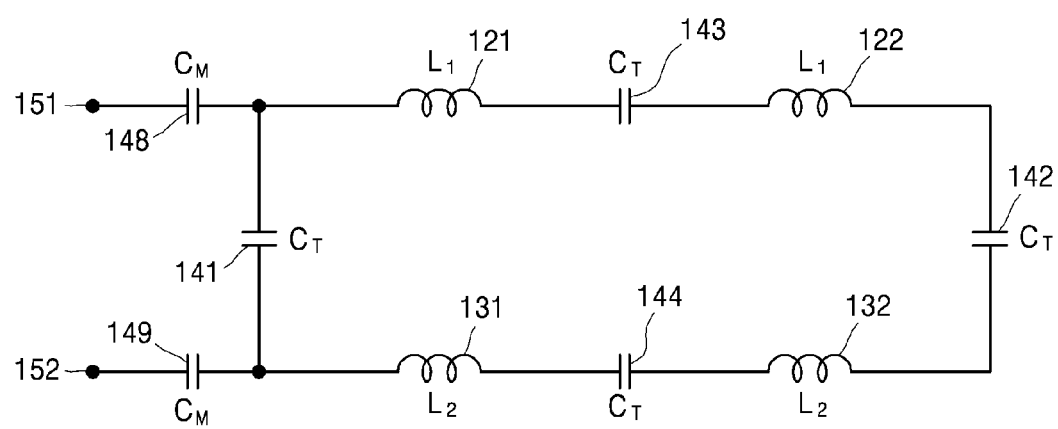
FIG. 5 is a circuit diagram of an electrical circuit equivalent to one vertical loop coil according to an exemplary embodiment.

FIG. 5 is a circuit diagram of an electrical circuit equivalent to one vertical loop coil in a state in which a mutual magnetic coupling between vertical loop coils is canceled, according to an exemplary embodiment. Referring to FIGS. 3 and 5, one vertical loop coil includes the inner conductor 120 and the outer conductor 130. The first and second resonant frequency adjustment capacitors 141 and 142 are inserted between the inner and outer conductors 120 and 130. Also, the inner conductor 120 and the outer conductor 130 are divided at locations, respectively, and the third and fourth resonant frequency adjustment capacitors 143 and 144 are inserted at the locations, respectively. In the current exemplary embodiment, the inner conductor 120 is divided into two inner sub conductors 121 and 122 and the outer conductor 130 is divided into two outer sub conductors 131 and 132, but exemplary embodiments are not limited thereto. In the RF coil 100 according to the current exemplary embodiment, a vertical loop coil may be divided at at least two locations and the resonant frequency adjustment capacitors 141, 142, 143, and 144 may be inserted at the at least two locations. A number of portions and resulting sub conductors into which the vertical loop coil is divided may vary according to an operating frequency and the size of the vertical loop coils. In general, the higher the operating frequency is and the greater the size of the vertical loop coils is, the larger the number of portions and resulting sub conductors into which the vertical loop coil may be divided. When the vertical loop coil is divided at at least two locations, the resonant frequency adjustment capacitors 141, 142, 143, and 144 are inserted at the at least two locations, and the vertical loop coil is allowed to resonate, the intensity of current flowing through the vertical loop coil has a uniform distribution, thereby forming a more uniform RF magnetic field. For example, when the inner frame 111 has a diameter of 55 cm, the outer frame 112 has a diameter of 60 cm, the inner conductor 120 and the outer conductor 130 are each 50 cm long, and an operating frequency is 123 MHz, it may be efficient that the vertical loop coil is divided at four locations, i.e., at both ends of the inner conductor 120 and the outer conductor 130 and midpoints on the inner conductor 120 and the outer conductor 130.

Figure 9:
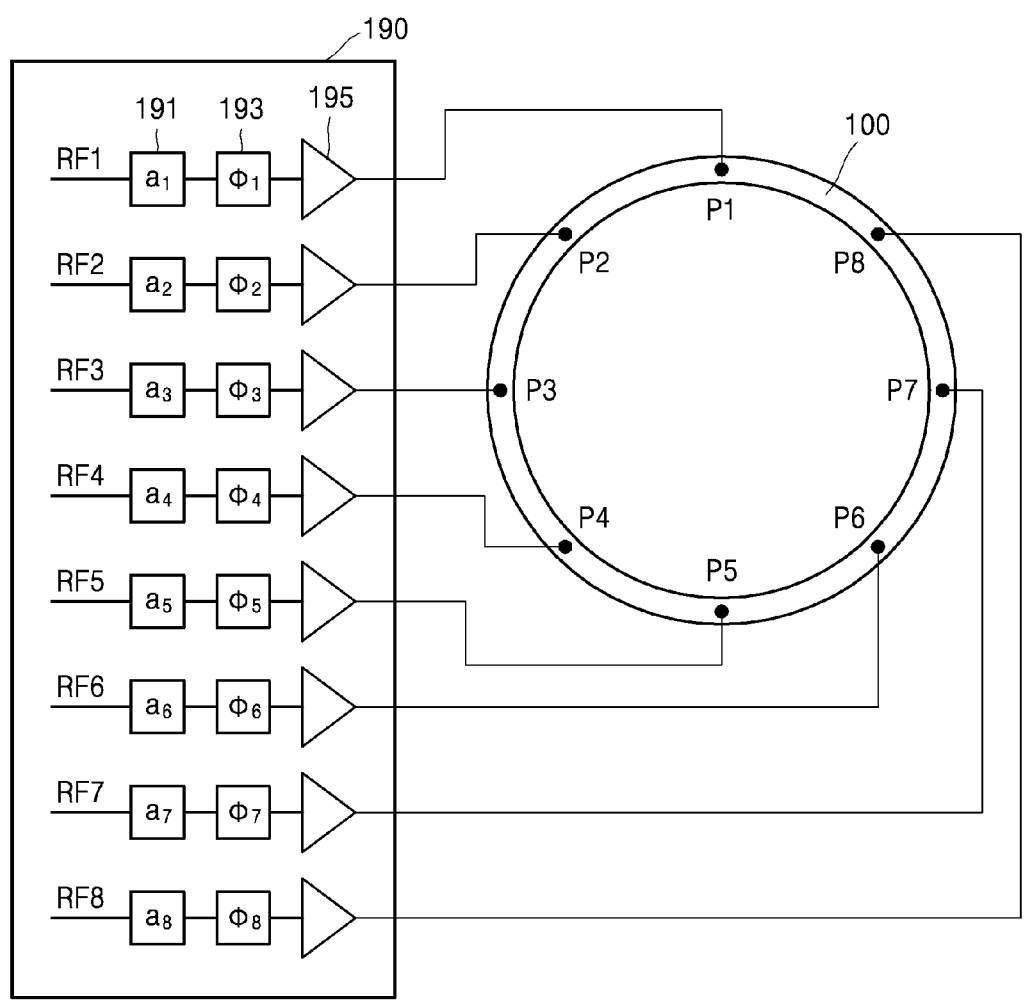
FIG. 9 illustrates a phased array RF coil system according to an exemplary embodiment.

A first port 151 and a second port 152 connected to, for example, a controller 190 of FIG. 9 are installed at one end of the inner conductor 120 and one end of the outer conductor 130, respectively. To efficiently drive the vertical loop coil, an electrical impedance of the vertical loop coil should match a characteristic impedance, e.g., 50 ohms. To this end, impedance matching capacitors 148 and 149 are inserted between the first port 151 and the inner conductor 120 and between the second port 152 and the outer conductor 130, respectively. The impedance matching capacitors 148 and 149 match a characteristic impedance of the controller 190 and an impedance of the RF coil 100 by selecting an appropriate capacitance value $C_M$.

In FIG. 5, 'L1' denotes an inductance equivalent to the inner sub conductors 121 and 122, and 'L2' denotes an inductance equivalent to the outer sub conductors 131 and 132. Although for convenience of explanation, the inner sub conductors 121 and 122 have been described above as having the same inductance, the inner sub conductors 121 and 122 may have different inductances. Similarly, although the outer sub conductors 131 and 132 have been described above as having the same inductance, the outer sub conductors 131 and 132 may have different inductances. Furthermore, the resonant frequency adjustment capacitors 141, 142, 143, and 144 may have different capacitance values (e.g., $C_{T1}$, $C_{T2}$, $C_{T3}$, $C_{T4}$) if needed.

Figure 6:
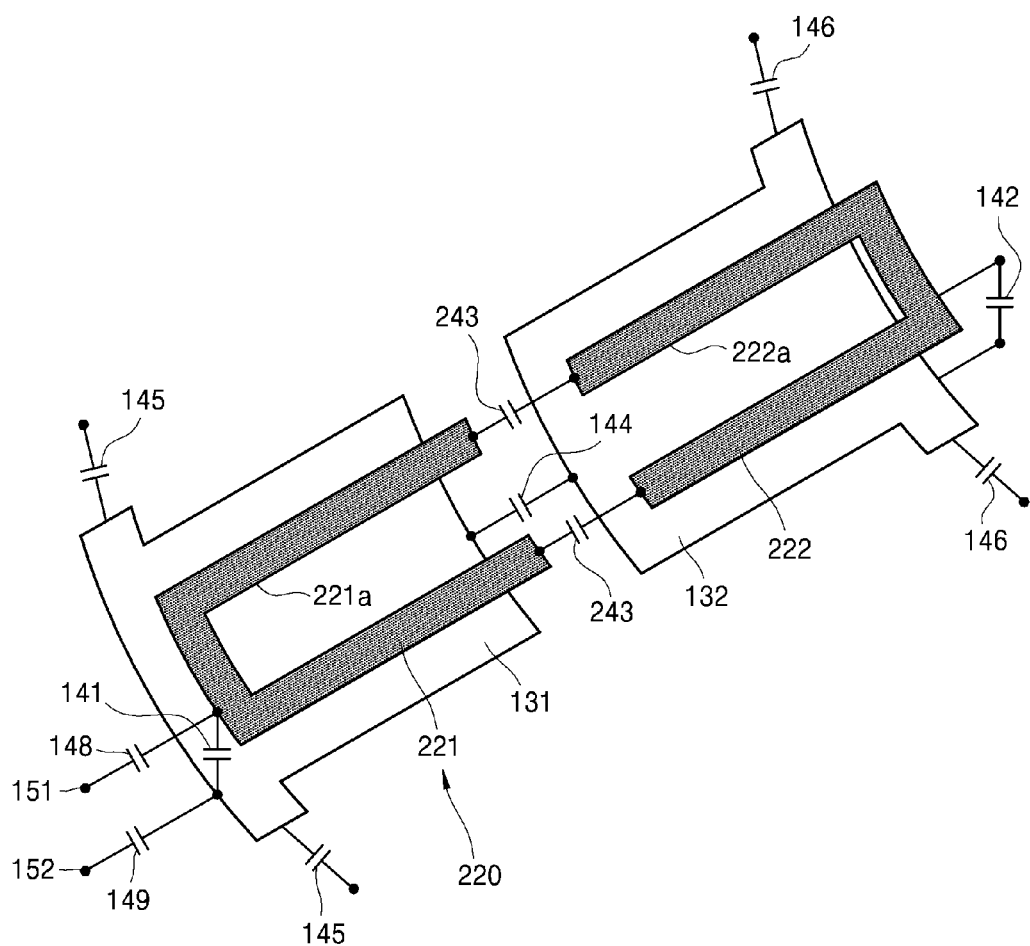
FIG. 6 illustrates a vertical loop coil of a phased array RF coil according to another exemplary embodiment.

FIG. 6 specifically illustrates a vertical loop coil of a phased array RF coil according to another exemplary embodiment.

Referring to FIG. 6, the RF coil includes a vertical loop coil including an inner conductor 220 and an outer conductor 130 disposed on the inner frame 111 and the outer frame 112 of the cylindrical frame 110 of FIG. 2, respectively. Inner sub conductors 221 and 222 divided from the inner conductor 220 may have a 'U'-shape from which a portion 221a is removed and a 'U'-shape from which a portion 222b is removed, respectively, unlike the inner sub conductors 121 and 122 of FIG. 3. That is, the two inner sub conductors 221 and 222 may be formed such that a majority of central portions and portions facing each other are removed, with the exception of outside portions that face each other. First resonant frequency adjustment capacitors 243 are inserted at two locations at which the two inner sub conductors 221 and 222 face each other, respectively. Thus, the two inner sub conductors 221 and 222 form one loop shape together. The RF coil according to the current exemplary embodiment is substantially the same as the RF coil 100 described above with reference to FIGS. 2 to 5, except for the structure of the inner conductor 220.

If the inner conductor 220 or the outer conductor 130 has an excessively large width, an excessive amount of eddy current may be generated due to a gradient magnetic field. Since the gradient magnetic field is applied in the form of a pulse to obtain a magnetic resonance image, eddy current is generated at a conductor near a gradient magnetic field coil when the gradient magnetic field is switched. Formation of a magnetic resonance image is negatively influenced by the eddy current, and thus the eddy current should be prevented from being generated in the RF coil. In the current exemplary embodiment, since the portions 221a and 222b are removed from the inner sub conductors 221 and 222 as described above, the areas of the inner sub conductors 221 and 222 may be reduced. By reducing the areas of the inner sub conductors 221 and 222, the eddy current may be suppressed at the inner sub conductors 221 and 222 when RF power is supplied, thereby reducing noise and preventing power loss.

In the current exemplary embodiment, a magnetic field is uniformly formed in the RF coil, for example, when the inner frame 111 has a diameter of 55 cm, the outer frame 112 has a diameter of 60 cm, the inner conductor 120 and the outer conductor 130 are each 50 cm long, a central angle $\theta_1$ of the inner conductor 120 is 40 degrees, and a central angle $\theta_2$ of the outer conductor 130 is 60 degrees.

The shapes and locations of the portions 221a and 222b removed from the inner sub conductors 221 and 222, as illustrated in FIG. 6, are for illustrative purposes only and are not limited thereto. As another example, portions of the inner sub conductors 221 and 222 may be removed in any of other various forms, e.g., in the form of a comb or a circle. Although in the current exemplary embodiment, the inner conductor 220 is divided into the two inner sub conductors 221 and 222, the inner conductor 220 may or may not be divided or may be divided into three or more inner sub conductors. When the inner conductor 220 is not divided into three or more inner sub conductors, a central portion of the inner conductor 220 may be removed. If the inner conductor 220 is divided into three or more inner sub conductors, outermost inner sub conductors may have the same shape as the inner sub conductors 221 and 222 illustrated in FIG. 6, and the remaining middle inner sub conductor(s) may have a conducting wire shape connecting the outermost inner sub conductors.

Figure 7A:
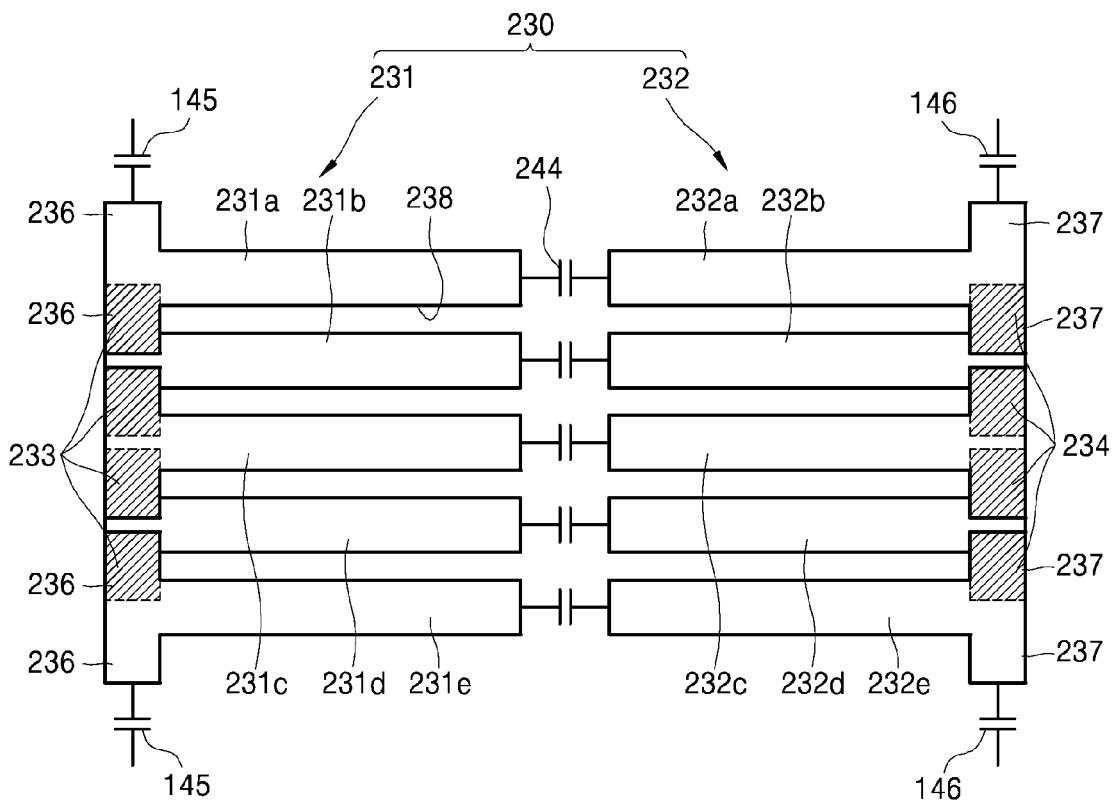
FIGS. 7A and 7B illustrate an outer conductor of one vertical loop coil of a phased array RF coil according to another exemplary embodiment.
Figure 7B:
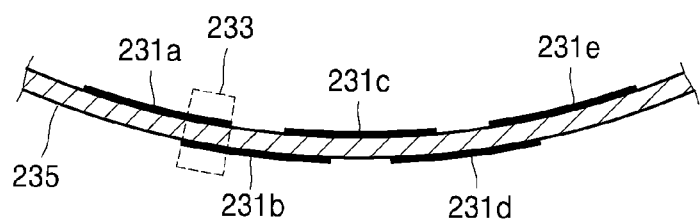

FIGS. 7A and 7B illustrate an outer conductor 230 of one vertical loop coil of a phased array RF coil according to another exemplary embodiment. The RF coil according to the current exemplary embodiment is substantially the same as the RF coil 100 described above with reference to FIGS. 2 to 5, except for an outer conductor 230.

Referring to FIGS. 7A and 7B, the RF coil according to the current exemplary embodiment includes a vertical loop coil including the inner conductor 120 of FIG. 2 and an outer conductor 230 installed on the inner frame 111 and the outer frame 112 of the cylindrical frame 110 of FIG. 2, respectively. Each of the outer conductors 230 may be divided into two or more parts, e.g., a plurality of outer sub conductors 231 and 232 along the lengthwise direction. A resonant frequency adjustment capacitor 244 is installed between the plurality of outer sub conductors 231 and 232 to adjust a resonant frequency. The one outer sub conductor 231 includes a plurality of outer conductor plate pieces 231a, 231b, 231c, 231d, and 231e arranged to partially overlap, having an insulating layer 235 therebetween. For example, the first, third, and fifth outer conductor plate pieces 231a, 231c, and 231e are disposed at an inner side of the insulating layer 235, and the second and fourth outer conductor plate pieces 231*b* and 231*d* may be disposed at an outer side of the insulating layer 235. Similarly, the another outer sub conductor 232 includes a plurality of outer conductor plate pieces 232*a*, 232*b*, 232*c*, 232*d*, and 232*e* arranged to partially overlap.

Each of the plurality of outer conductor plate pieces 231*a*, 231*b*, 231*c*, 231*d*, and 231*e*, and similarly, each of the plurality of outer conductor plate pieces 232*a*, 232*b*, 232*c*, 232*d*, and 232*e*, may be a conductor plate having a curved surface formed along the circumference of a curved surface of the outer frame 112 or may be a flat conductor plate. Wings 236 and 237 extend from outer ends of outer conductor plate pieces 231*a*, 231*b*, 231*c*, 231*d*, and 231*e* and from outer ends of outer conductor plate pieces 232*a*, 232*b*, 232*c*, 232*d*, and 232*e*, respectively, in a circumferential direction of the outer frame 112. The wings 236 of the plurality of outer conductor plate pieces 231*a*, 231*b*, 231*c*, 231*d*, and 231*e*, and similarly, the wings 237 of the plurality of outer conductor plate pieces 232*a*, 232*b*, 232*c*, 232*d*, and 232*e*, overlap with one another and have the insulating layer 235 therebetween. The remaining portions of the plurality of outer conductor plate pieces 231*a*, 231*b*, 231*c*, 231*d*, and 231*e* and of the plurality of outer conductor plate pieces 232*a*, 232*b*, 232*c*, 232*d*, and 232*e*, except for the wings 236 and 237, are disposed not to overlap. Furthermore, the remaining portions of the plurality of outer conductor plate pieces 231*a*, 231*b*, 231*c*, 231*d*, and 231*e* and of the plurality of outer conductor plate pieces 232*a*, 232*b*, 232*c*, 232*d*, and 232*e*, except for the wings 236 and 237, may be disposed apart from one another, having slits 238 formed at predetermined intervals therebetween.

The insulating layer 235 is formed at least between overlapping portions 233 and 234 of the outer conductor 230. The insulating layer 235 may also be formed on the entire outer frame 112. The insulating layer 235 may be formed of a dielectric material having high insulating properties, e.g., teflon.

The overlapping portions 233 and 234 of the plurality of outer conductor plate pieces 231*a*, 231*b*, 231*c*, 231*d*, and 231*e* and of the plurality of outer conductor plate pieces 232*a*, 232*b*, 232*c*, 232*d*, and 232*e* are regions obtained when the plurality of outer conductor plate pieces 231*a*, 231*b*, 231*c*, 231*d*, and 231*e* are formed having the insulating layer 235 therebetween and thus each have a structure similar to a capacitor structure, as illustrated in FIG. 7B. Since the plurality of outer conductor plate pieces 231*a*, 231*b*, 231*c*, 231*d*, and 231*e* (and similarly, the plurality of outer conductor plate pieces 232*a*, 232*b*, 232*c*, 232*d*, and 232*e*) are insulated from one another via the insulating layer 235, the outer conductor 230 is divided into a plurality of regions in a gradient magnetic field having a low frequency band, thereby suppressing eddy current. Due to the overlapping portions 233 and 234 having a capacitor structure, the plurality of outer conductor plate pieces 231*a*, 231*b*, 231*c*, 231*d*, and 231*e*, and similarly, the plurality of outer conductor plate pieces 232*a*, 232*b*, 232*c*, 232*d*, and 232*e*, operate as one conductor together at an RF band. The plurality of outer conductor plate pieces 231*a*, 231*b*, 231*c*, 231*d*, and 231*e* and the plurality of outer conductor plate pieces 232*a*, 232*b*, 232*c*, 232*d*, and 232*e* cover a large area while suppressing eddy current, and thus an outside electric field may be effectively suppressed. That is, in the current exemplary embodiment, the plurality of outer conductor plate pieces 231*a*, 231*b*, 231*c*, 231*d*, and 231*e* and the plurality of outer conductor plate pieces 232*a*, 232*b*, 232*c*, 232*d*, and 232*e* may be considered as a single outer conductor 130, at an RF band in an electrical view.

Figure 8A:
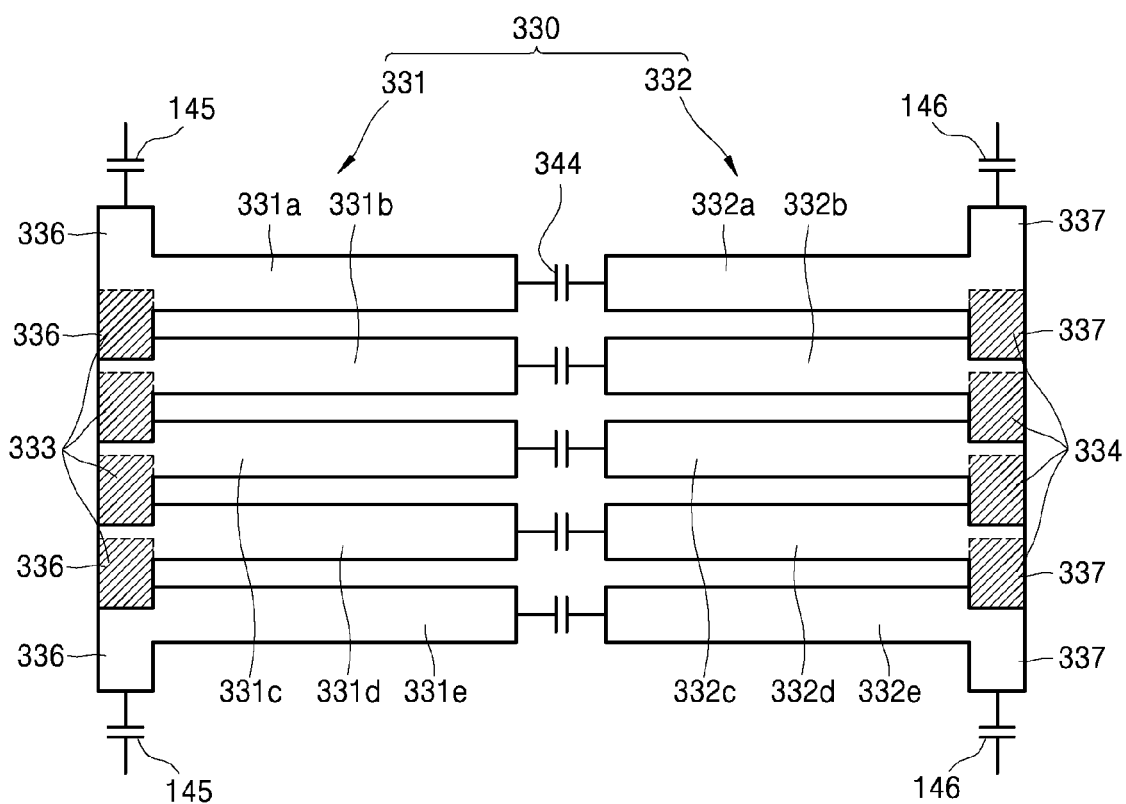
FIGS. 8A and 8B illustrate an outer conductor of one vertical loop coil of a phased array RF coil according to another exemplary embodiment.
Figure 8B:
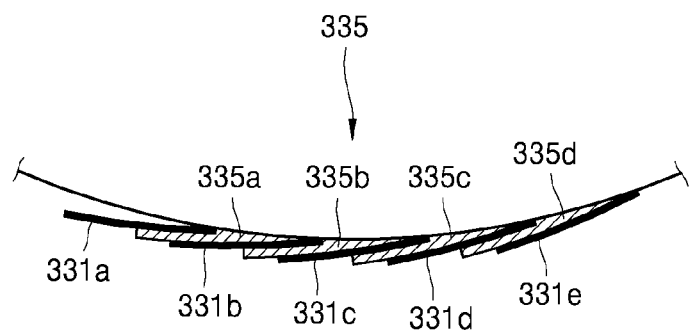

FIGS. 8A and 8B illustrate an outer conductor 330 of one vertical loop coil of a phased array RF coil according to another exemplary embodiment. The RF coil according to the current exemplary embodiment is substantially the same as the RF coil 100 as described above with reference to FIGS. 2 to 5, except for the outer conductor 330.

Referring to FIGS. 8A and 8B, the RF coil according to the current exemplary embodiment includes a vertical loop coil including the inner conductor 120 of FIG. 2 and the outer conductor 330 installed on the inner frame 111 and the outer frame 112 of the cylindrical frame 110 of FIG. 2, respectively. Each of the outer conductors 330 may be divided into two or more parts, e.g., a plurality of outer sub conductors 331 and 332 along the lengthwise direction.

An insulating layer 335 includes a plurality of insulating layer pieces 335*a*, 335*b*, 335*c*, and 335*d*. The one outer sub conductor 331 includes a plurality of outer conductor plate pieces 331*a*, 331*b*, 331*c*, 331*d*, and 331*e*. Each of the plurality of outer conductor plate pieces 331*a*, 331*b*, 331*c*, 331*d*, and 331*e* may be a conductor plate having a curved surface formed along the circumference of the curved surface of the outer frame 112 or may be a flat conductor plate. Similarly, another outer sub conductor 332 includes a plurality of outer conductor plate pieces 332*a*, 332*b*, 332*c*, 332*d*, and 332*e*. A resonant frequency adjustment capacitors 344 are installed between the plurality of outer conductor plate pieces 331*a*, 331*b*, 331*c*, 331*d*, and 331*e* of the one outer sub conductor 331 and the plurality of outer conductor plate pieces 332*a*, 332*b*, 332*c*, 332*d*, and 332*e* of the another outer sub conductor 332. Wings 336 and 337 extend from outer ends of the plurality of outer conductor plate pieces 331*a*, 331*b*, 331*c*, 331*d*, and 331*e* and of the plurality of outer conductor plate pieces 332*a*, 332*b*, 332*c*, 332*d*, and 332*e*, respectively, in a circumferential direction of the outer frame 112. The plurality of outer conductor plate pieces 331*a*, 331*b*, 331*c*, 331*d*, and 331*e* (and similarly, the plurality of outer conductor plate pieces 332*a*, 332*b*, 332*c*, 332*d*, and 332*e*) are alternately arranged along the circumference of the outer frame 112. One wing 336 of the first outer conductor plate piece 331*a* is arranged to be placed below one wing 336 of the second outer conductor plate piece 331*b*, and the insulating layer piece 335*a* is disposed between the first outer conductor plate piece 331*a* and the second outer conductor plate piece 331*b*. The other outer conductor plate pieces 331*b*, 331*c*, 331*d*, and 331*e* and outer conductor plate pieces 332*a*, 332*b*, 332*c*, 332*d*, and 332*e* are arranged similarly. The remaining portions of the plurality of outer conductor plate pieces 331*a*, 331*b*, 331*c*, 331*d*, and 331*e* and of the plurality of outer conductor plate pieces 332*a*, 332*b*, 332*c*, 332*d*, and 332*e* except for the wings 336 and 337 do not overlap with one another.

The current exemplary embodiment is substantially the same as the exemplary embodiment described above with reference to FIGS. 7A and 7B in that overlapping portions 333 of the plurality of outer conductor plate pieces 331*a*, 331*b*, 331*c*, 331*d*, and 331*e* and overlapping portions 334 of the plurality of outer conductor plate pieces 332*a*, 332*b*, 332*c*, 332*d*, and 332*e* each have a structure similar to a capacitor structure and operate as if they are electrically connected when RF power is supplied thereto FIG. 9 illustrates a phased array RF coil system according to an exemplary embodiment.

Referring to FIG. 9, the RF coil system according to the current exemplary embodiment includes an RF coil 100 and the controller 190 that drives the RF coil 100.

The RF coil 100 may be the same as one of the RF coils described above. The RF coil 100 may include eight vertical loop coils as illustrated in FIG. 2, and eight input terminal ports P1, P2, P3, . . . , and P8 may thus be formed therein.

The controller 190 may include attenuators 191, phase shifters 193, and RF power amplifiers 195. The attenuators 191 and the phase shifters 193 may be included in a main controller of an MRI apparatus, such as an RF pulse generator of a spectrometer. Alternatively, the attenuators 191 and the phase shifters 193 may be embodied as separate elements. A number of the RF power amplifiers 195 may be equal to the number of the input terminal ports P1, P2, P3, . . . , and P8. RF signals RF1, RF2, RF3, . . . , and RF8 that are input to controller 190 are respectively supplied to the input terminal ports P1, P2, P3, . . . , and P8 via the attenuators 191, the phase shifters 193, and the RF power amplifiers 195.

Figure 10:
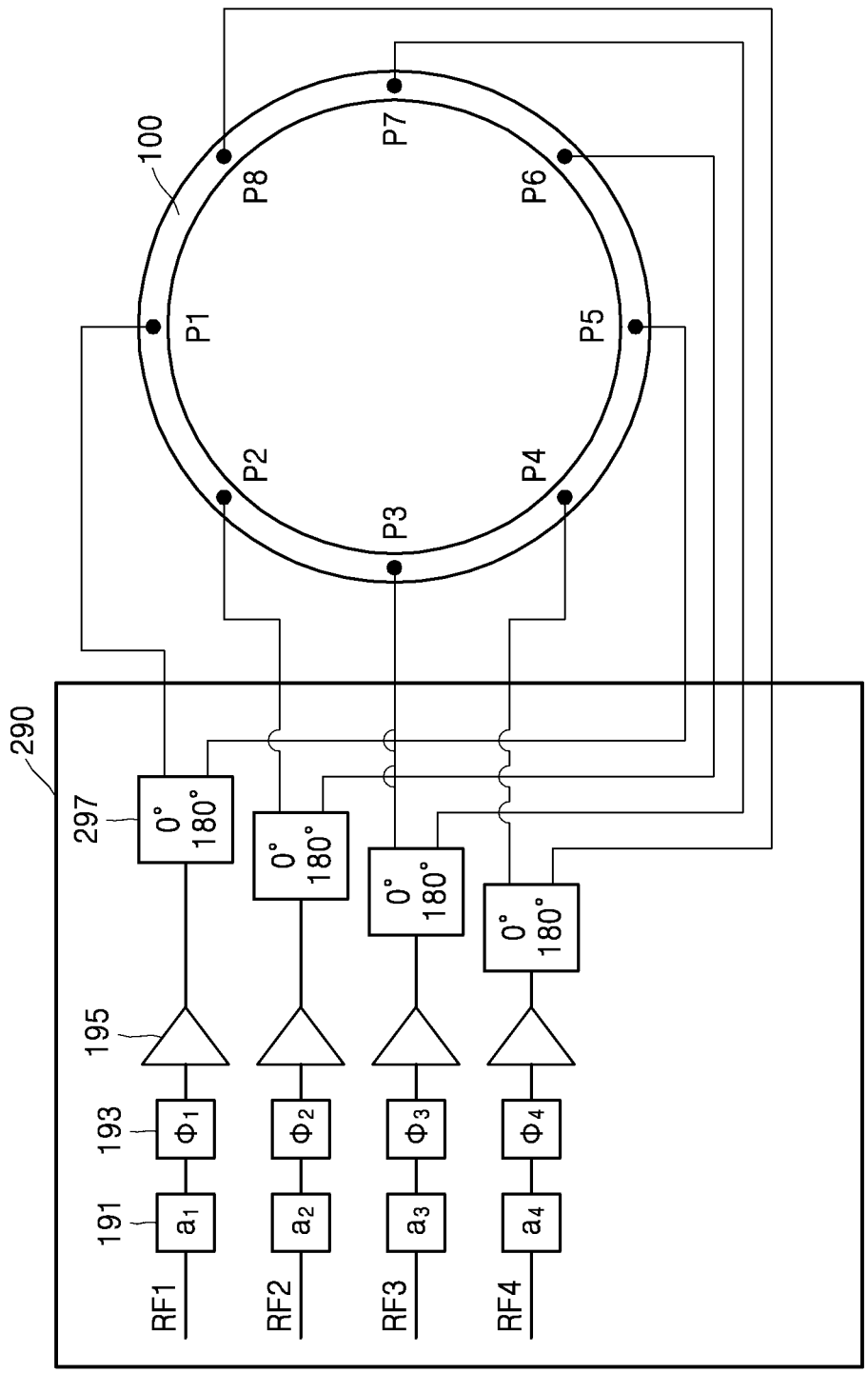
FIG. 10 illustrates a phased array RF coil system according to another exemplary embodiment.

FIG. 10 illustrates a phased array RF coil system according to another exemplary embodiment.

Referring to FIG. 10, the RF coil system according to the current exemplary embodiment includes an RF coil 100 and a controller 290 that drives the RF coil 100.

The controller 290 may include attenuators 191, phase shifters 193, RF power amplifiers 195, and power dividers 297. A number of the RF power amplifiers 195 may be half the number of input terminal ports P1, P2, P3, . . . and P8. The intensity of RF power output from the RF power amplifiers 195 is the same as that of RF power supplied to two vertical loop coils. The power dividers 297 each divide an input power signal into two power signals having the same intensity, the phases of which are shifted by 180 degrees of each other. Phase shifting performed by each of the power dividers 297 may be realized by using an LC element or transmission lines, such as coaxial lines or micro strip lines.

An output terminal of one power divider 297 is connected to input terminal ports of vertical loop coils facing each other, e.g., the input terminal ports P1 and P5, P2 and P6, P3 and P7, or P4 and P8. Thus, two vertical loop coils facing each other may be driven using one RF power amplifier 195.

In general, since the RF power amplifiers 195 are large and expensive, increasing the number of the RF power amplifiers 195 is limited in terms of spatial and economical aspects. In the current exemplary embodiment, since the power dividers 297 are used, the number of the RF power amplifiers 195 may be reduced to half the number used in a conventional method, thereby reducing the space occupied by the controller 290 and saving manufacturing costs.

Next, an operation of the MRI apparatus according to the current exemplary embodiment will be described.

The MRI apparatus photographs a cross section of a human body, based on nuclear magnetic resonance (NMR). When the atomic nuclei present in a human body, e.g., hydrogen (1H), phosphorus ($3^1$P), natrium ($2^3$Na), and carbon isotopes ($1^3$C), are exposed to a main magnetic field generated by the main magnet 10 of FIG. 1, the atomic nuclei are magnetized to cause magnetization vectors thereof to make a precessional motion with respect to an external magnetic field. The frequency of the precessional motion is referred to as the Larmor frequency. The Larmor frequency is proportional to the intensity of the external magnetic field, and the proportional constant is referred to as a gyromagnetic ratio. Each element having nuclear magnetic resonance properties has a unique gyromagnetic ratio. The RF coil 100 applies an RF magnetic field having the Larmor frequency as a main frequency to the magnetization vectors making the precessional motion. Thus, the magnetization vectors resonate to lie in a direction along a plane perpendicular to the main magnetic field. The magnetization vectors lying in the direction along the plane become a signal source of a magnetic resonance image. The magnetization vectors lying in the direction along the plane induce a voltage signal to be generated in the RF coil 100 adjacent thereto. In general, the voltage signal is referred to as a free induction decay (FID) signal. The RF coil 100 according to the current exemplary embodiment is capable of causing the magnetization vectors to resonate (transmission mode) and receiving the magnetic resonance signal (reception mode), or may be used as an RF coil only for the transmission mode according to circumstances. A coil for performing both the transmission mode and the reception mode is referred to as transceiving coil, a coil for performing only the transmission mode is referred to as a transmitting coil, and a coil for performing only the reception mode is referred to as a receiving coil.

A signal-to-noise ratio and luminance uniformity of a magnetic resonance image are important factors in evaluating the quality of the magnetic resonance image. The signal-to-noise ratio of the magnetic resonance image is proportional to a main magnetic field, i.e., a magnetic field of a superconductive electromagnet or a permanent magnet which is an element of an MRI apparatus. However, if the intensity of the main magnetic field increases, the signal-to-noise ratio increases but the luminance uniformity may be degraded. A hydrogen element has a resonance frequency of about 128 MHz at a magnetic field of 3.0 tesla. At this resonance frequency, the wavelengths of electromagnetic waves in a human body are about 30 cm. The wavelengths of electromagnetic waves in a human body is much shorter than those of electromagnetic waves in the air, since a large amount of water molecules having strong polarization properties are present in the human body. As the wavelengths of the electromagnetic waves in the human body are much shorter, the electromagnetic waves decrease in terms of intensity and are delayed in the human body. Thus, it is difficult for an RF magnetic field to be uniformly generated in the human body. If a uniform RF magnetic field is not generated in the human body, the quality of the magnetic resonance image may be greatly degraded. In particular, when the uniformity of a magnetic field is low and the RF coil is in the transmission mode, the degree of uniformity of both the magnetic resonance image and the contrast of the magnetic resonance image may be degraded. This is because, among the factors that determine the contrast of the magnetic resonance image, a spin-lattice relaxation time T1 depends on a flip angle of a magnetization vector, and the flip angle depends on the intensity of an RF magnetic field. Thus, a uniform RF magnetic field needs to be applied to an internal part of a human body, of which an image is to be generated, so as to form a uniform flip angle when the phased array RF coil is in the transmission mode.

The magnetic resonance imaging apparatus according to the current exemplary embodiment uses the phased array RF coil 100 in which a plurality of RF coils are arranged so as to form a uniform RF magnetic field in a human body at a high magnetic field of about 3.0 tesla. The MRI apparatus is capable of easily performing B1 shimming to increase the degree of uniformity of an RF magnetic field within the human body by independently controlling the intensity and phase of an RF signal supplied to each of vertical loop coils included in the phased array RF coil 100.

The described-above exemplary embodiments and advantages are merely exemplary and are not to be construed as limiting. The present teaching can be readily applied to other types of apparatuses. The description of exemplary embodiments is intended to be illustrative, and not to limit the scope of the claims, and many alternatives, modifications, and variations will be apparent to those skilled in the art.

What is claimed is:

1. A phased array radio-frequency (RF) coil for magnetic resonance imaging (MRI), the phased array RF coil comprising:
   a cylindrical frame including a coaxial inner frame and a coaxial outer frame having different diameters and extending between a first end of the cylindrical frame and a second end of the cylindrical frame in a lengthwise direction; and
   vertical loop coils arranged in a circumferential direction of the cylindrical frame, wherein each vertical loop coil comprises:
   an inner conductor extending on the coaxial inner frame in the lengthwise direction between the first and second ends of the cylindrical frame;
   an outer conductor extending on the coaxial outer frame in the lengthwise direction between the first and second ends of the cylindrical frame and facing the inner conductor;
   a first resonant frequency adjustment capacitor which connects one end of the inner conductor and one end of the outer conductor at the first end of the cylindrical frame; and
   a second resonant frequency adjustment capacitor which connects another end of the inner conductor and another end of the outer conductor at the second end of the cylindrical frame,
   wherein the first resonant frequency adjustment capacitor, the inner conductor, the second resonant frequency adjustment capacitor, and the outer conductor are connected to one another to form an electrical loop, and
   the first resonant frequency adjustment capacitor and the second resonant frequency adjustment capacitor cooperate so that the phased array RF coil resonates at an MR operating frequency.

2. The phased array RF coil of claim 1, wherein the inner conductor comprises inner sub conductors disposed along the lengthwise direction, and the phased array RF coil further comprises:
   a third resonant frequency adjustment capacitor which is connected between each pair of the inner sub conductors in the lengthwise direction.

3. The phased array RF coil of claim 2, wherein the outer conductor comprises outer sub conductors disposed along the lengthwise direction, and the phased array RF coil further comprises:
   a fourth resonant frequency adjustment capacitor which is connected between each pair of the outer sub conductors in the lengthwise direction.

4. The phased array RF coil of claim 3, wherein a number of the inner sub conductors is equal to a number of the outer sub conductors.

5. The phased array RF coil of claim 3, further comprising:
   decoupling capacitors which are connected between adjacent vertical loop coils to independently drive each of the vertical loop coils.

6. The phased array RF coil of claim 1, wherein the outer conductor comprises outer sub conductors disposed along the lengthwise direction, the phased array RF coil further comprises:
   a fourth resonant frequency adjustment capacitor which is connected between each pair of the outer sub conductors.

7. The phased array RF coil of claim 1, wherein the vertical loop coils are disposed at isogonal intervals along a circumference of the cylindrical frame.

8. The phased array RF coil of claim 1, wherein the inner conductor is a conductor plate, of which a portion is removed.

9. The phased array RF coil of claim 1, wherein a width of the outer conductor in the circumferential direction of the outer frame is greater than a width of the inner conductor in the circumferential direction of the inner frame.

10. The phased array RF coil of claim 1, wherein the inner conductor is a conductor plate that has a curved surface and is bent along a circumference of the inner frame.

11. The phased array RF coil of claim 10, wherein the outer conductor is a conductor plate that has a curved surface and is bent along a circumference of the outer frame.

12. The phased array RF coil of claim 11, wherein a central angle of the outer conductor is greater than a central angle of the inner conductor, with respect to a central axis on the cylindrical frame.

13. The phased array RF coil of claim 1, wherein the outer conductor comprises:
   an insulating layer; and
   outer conductor plate pieces which are arranged on both sides of the insulating layer, to partially overlap, as viewed in a cross-sectional direction of the insulating layer.

14. The phased array RF coil of claim 13, wherein the outer conductor plate pieces comprise:
   first outer conductor plate pieces disposed at an inner side of the insulating layer and second outer conductor plate pieces disposed at an outer side of the insulating layer,
   wherein the insulating layer is disposed between the first outer conductor plate pieces and the second outer conductor plate pieces.

15. The phased array RF coil of claim 13, wherein the insulating layer comprises insulating layer pieces,
   each of the outer conductor plate pieces comprises a first side and a second side opposing the first side,
   the outer conductor plate pieces are arranged such that a first side of one of the outer conductor plate pieces is disposed below a second side of an adjacent one of the outer conductor plate pieces, along a circumference of the outer frame, and
   the insulating layer pieces are respectively inserted into regions which are disposed between overlapping outer conductor plate pieces.

16. The phased array RF coil of claim 1, further comprising:
   decoupling capacitors which are disposed between each pair of the vertical loop coils to independently drive each of the vertical loop coils.

17. A radio-frequency system for magnetic resonance imaging (MRI), the system comprising:
   a phased array radio-frequency (RF) coil including a cylindrical frame including a coaxial inner frame and a coaxial outer frame having different diameters and extending between a first end of the cylindrical frame and a second end of the cylindrical frame in a lengthwise direction, and vertical loop coils arranged in a circumferential direction of the cylindrical frame; and
   a controller configured to drive the phased array RF coil,
   wherein each vertical loop coil comprises:
   an inner conductor extending on the coaxial inner frame, in the lengthwise direction between the first and second ends of the cylindrical frame;

an outer conductor extending on the coaxial outer frame in the lengthwise direction between the first and second ends of the cylindrical frame and facing the inner conductor;

a first resonant frequency adjustment capacitor which connects one end of the inner conductor and one end of the outer conductor at the first end of the cylindrical frame; and a second resonant frequency adjustment capacitor which connects another end of the inner conductor and another end of the outer conductor at the second end of the cylindrical frame, wherein the first resonant frequency adjustment capacitor, the inner conductor, the second resonant frequency adjustment capacitor, and the outer conductor are connected to one another to form an electrical loop, and the first resonant frequency adjustment capacitor and the second resonant frequency adjustment capacitor cooperate so that the phased array RF coil resonates at an MR operating frequency.

18. The radio-frequency system of claim 17, wherein the controller comprises RF power amplifiers connected to the vertical loop coils.

19. The radio-frequency system of claim 18, wherein a number of the RF power amplifiers is equal to a number of the vertical loop coils.

20. The radio-frequency system of claim 18, wherein the controller further comprises:

a power divider configured to divide RF power output from the RF power amplifiers into power signals having a predetermined phase difference with respect to one another and supply the power signals to the vertical loop coils, wherein a number of the vertical loop coils is equal to a number of the power signals.

21. The radio-frequency system of claim 20, wherein the power divider divides RF power output from the RF power amplifiers into two power signals, wherein phases of the two power signals are shifted by 180 degrees with respect to each other, and supplies the two power signals to two vertical loop coils that face each other with respect to a central axis on the cylindrical frame.

22. The radio-frequency system of claim 17, wherein the phased array RF coil is used only in a transmission mode or in both the transmission mode and a reception mode.

23. A magnetic resonance imaging (MRI) apparatus comprising:

a chamber including a cylindrical hollow portion;

a main magnet installed in the chamber;

a gradient coil installed in the cylindrical hollow portion of the chamber;

a phased array radio-frequency (RF) coil including:

a cylindrical frame installed in the cylindrical hollow portion of the chamber and including a coaxial inner frame and a coaxial outer frame having different diameters and extending between a first end of the cylindrical frame and a second end of the cylindrical frame in a lengthwise direction; and vertical loop coils arranged in a circumferential direction of the cylindrical frame; and a controller configured to drive and control the main magnet, the gradient coil, and the phased array RF coil;

wherein each vertical loop coil comprises:

an inner conductor extending on the coaxial inner frame in the lengthwise direction between the first and second ends of the cylindrical frame;

an outer conductor extending on the coaxial outer frame in the lengthwise direction between the first and second ends of the cylindrical frame and facing the inner conductor a first resonant frequency adjustment capacitor which connects one end of the inner conductor and one end of the outer conductor at the first end of the cylindrical frame; and a second resonant frequency adjustment capacitor which connects another end of the inner conductor and another end of the outer conductor at the second end of the cylindrical frame, wherein the first resonant frequency adjustment capacitor, the inner conductor, the second resonant frequency adjustment capacitor, and the outer conductor are connected to one another to form an electrical loop, and the first resonant frequency adjustment capacitor and the second resonant frequency adjustment capacitor cooperate so that the phased array RF coil resonates at an MR operating frequency.

24. The phased array RF coil of claim 1, wherein the first resonant frequency adjustment capacitor, the inner conductor, the second resonant frequency adjustment capacitor, and the outer conductor are connected in this order.

* * * * *